United States Patent [19]

Unemura

[11] Patent Number: 5,771,296
[45] Date of Patent: Jun. 23, 1998

[54] AUDIO CIRCUIT

[75] Inventor: Toyoaki Unemura, Itami, Japan

[73] Assignee: Matsushita Electric Industrial Co., Ltd., Osaka, Japan

[21] Appl. No.: 559,578

[22] Filed: Nov. 16, 1995

[30] Foreign Application Priority Data

Nov. 17, 1994 [JP] Japan .................................. 6-283423

[51] Int. Cl.$^6$ ..................................................... H03G 5/00
[52] U.S. Cl. ................................ 381/28; 381/61; 381/98
[58] Field of Search ................................... 381/61, 98, 28

[56] References Cited

U.S. PATENT DOCUMENTS

| | | |
|---|---|---|
| 4,180,707 | 12/1979 | Moog . |
| 4,698,842 | 10/1987 | Mackie et al. ............................ 381/98 |
| 4,700,390 | 10/1987 | Machida .................................. 381/61 |

FOREIGN PATENT DOCUMENTS 1-123554  5/1989  Japan .
5-49092   2/1993  Japan .
5-115100  5/1993  Japan .

*Primary Examiner*—Forester W. Isen
*Attorney, Agent, or Firm*—Ratner & Prestia

[57] ABSTRACT

An audio circuit for use in a television receiver and the like compensates for the capacity shortage of a speaker box or low frequency characteristic of the speaker to reproduce vivid and voluminous low frequency sound. L and R signals of the audio signal are mixed, and then an arbitrary low frequency band component is extracted therefrom by a filter having an arbitrary frequency characteristic, and extracted component is bisected by a distribution means, and only low frequency band component is added to the original L and R signals to reproduce the audio signal which is voluminous in a low frequency band. With a low frequency band which is difficult to be reproduced by a speaker, the harmonic is stressed by full-wave rectification means to stress low frequency sound feeling, and when a switching circuit is provided, low frequency sound stressing by an amplifier and low frequency sound harmonic stressing by full-wave rectification means can be easily switched.

2 Claims, 8 Drawing Sheets

FIG. 3A (1) 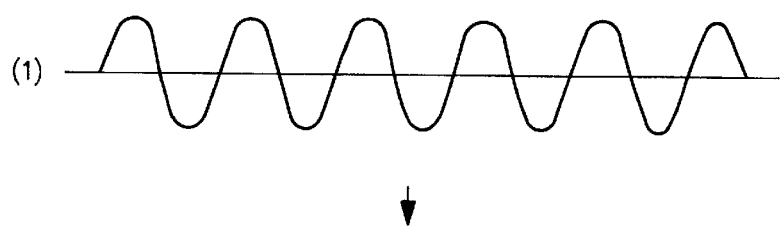
FIG. 3B (2) 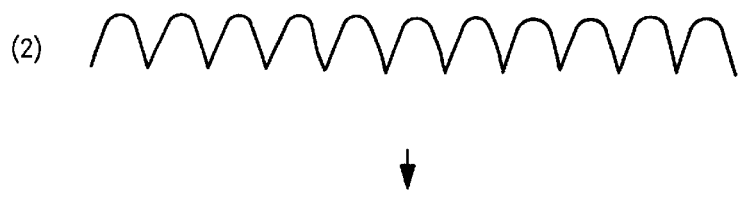
FIG. 3C (3) 

AUDIO CIRCUIT

BACKGROUND OF THE INVENTION

1. Field of the Invention

The present invention relates to an audio circuit for stressing a low frequency band characteristic used in what is called the general audio field such as an audio circuit of a television receiver.

2. Description of the Prior Art

Conventional audio circuits of television receivers or the like are not classified in the Hi-fi audio category but in the general audio category. Their audio quality is a radio cassette level. However, powerful and vivid sound output has been required from the market due to the progress of AV (audio-visual) soft. Action movies occupying the major portion of AV soft include large low frequency component in their sound, accordingly, sufficient reproducing the low frequency band component has been required for enhancing the powerfulness and vividness.

Affected by the Karaoke boom, a home Karaoke system connecting an LD player or a video tape recorder to a television receiver for enjoying Karaoke at home has been spot-lighted, so, a television receiver which can output lower frequency sound is also required here. From global points of view, the sound emphasized its high frequency sound and low frequency sound is preferred in some countries and some areas.

On the other hand, in the television market, cost reduction is further required, so speakers which are at the final step of sound outputs are also its target, against the movement of the market. The compactnizing and lightening of speakers cause lowering of the low frequency band characteristic of sound frequency characteristic (hereafter referred as f characteristic). To solve this problem, the low frequency band component of the sound is generally raised by an electronic circuit increase the voluminous feeling of the low frequency band.

An example of conventional audio circuits for stressing low frequency band will be illustrated referring to FIG. 7. In FIG. 7 which is a block diagram of a conventional audio circuit for stressing low frequency band, an AV switch (AVSW) 1 outputs output signals L1 and R1 by switching TV audio input signals TV-L, TV-R and video audio input signals AV-L, AV-R. Signals L1 and R1 are input to audio controller 2 to be controlled their bass, treble, balance, volume, surround, and the like and output therefrom as signals L2 and R2. Controller 3 sends switching instruction to AVSW 1 and command signals to audio controller 2 to execute various kinds of controls.

The output signal L2 of audio controller 2 is bisected, and one is connected to mixing amplifier 6 for mixing input signals through band pass filter (BPF) 4 for selecting an arbitrary low frequency band to output it as signal L3, the other is directly connected to mixing amplifier 6.

In a same manner, one of the output signal R2 of audio controller 2 is connected to mixing amplifier 7 for mixing input signals through BPF 5 for selecting an arbitrary low frequency band from its input signal to output as signal R3, the other is directly connected to mixing amplifier 7. Each of outputs of mixing amplifiers 6 and 7 are input to power amplifier 8 for amplifying signal L4 and R4 to output them as signal L5 and R5, and the amplified outputs are connected to a left side speaker (SP) 9 and right side speaker SP 10.

The operation of the conventional sample constituted as above will be illustrated. Input signals TV-L and TV-R or input signals AV-L and AV-R are switched by AVSW 1 according to a switching signal from controller 3 and output as signals L1 and R1. Signals L1 and R1 are processed at audio controller 2 according to various control signals from controller 3 for controlling bass, treble, balance, volume, surround, and the like and output as signals L2 and R2.

Signals L2 and R2 are respectively bisected, arbitrary low frequency band component are selected at BPF 4 and BPF 5 to output as signals L3 and R3 and mixed with original signals L2 and R2 at mixing amplifier 6 and mixing amplifier 7 to output as signals L4 and R4, thereby stressing the low frequency band component of the original signals. Signals L4 and R4 are amplified at power amplifier 8 to be signals L5 and R5 and reproduced at speaker 9 and speaker 10 as sound stressed in low frequency band. FIG. 8 shows an example of f characteristic of a conventional audio circuit.

PAT laid open H 5-49092 same above and others proposed conventional examples like above. There is also proposed a method for compensating sound signal deterioration during the transmission in the case of monophonic sound where sound band is limited from 0.3 to 3.4 KHz like a telephone line (PAT laid open H 1-123554). But there is no concrete compensating means disclosed.

In PAT laid open H 5-115100, an audio circuit for easy listening for a voice of a person at center is proposed, this is not for stressing low frequency sound. In its claim 2, it further provides a low frequency cut circuit to stress a middle frequency band. However, the constitution of conventional example shown in FIG. 7 is not sufficient in low frequency stressing. Further, f characteristic deterioration due to cost reduction in a speaker and a slimed speaker box causes insufficient low frequency feeling. The f characteristic shown by a solid line in FIG. 8 is that of an electric circuit. If f characteristic of speaker itself is added to, f characteristic of the audio output is further worsened.

SUMMARY OF THE INVENTION

An object of the invention is to solve conventional problems described above through providing an audio circuit capable of obtaining more effective low sound stressing effect. To achieve above object, a first constitution of the audio circuit of the invention comprises:

mix means for mixing a first audio signal and a second audio signal;

a filter for extracting a fourth audio signal from a third audio signal output from said mix means to output, said fourth audio signal having an arbitrary frequency characteristic extracted on the basis of a specific frequency in a low frequency band and having the most suitable fO value and Q value for a speaker used;

distribution means for distributing said fourth audio signal into at least two as fifth audio signals; and, add means for adding said fifth audio signal distributed by said distribution means on said first audio signal and second audio signal. This enables the reproduction of the sound with an affluent low frequency band.

The first constitution can further comprises a control means for controlling the on-off or the signal level of the fourth audio signal so that a signal level of a specific frequency band having an arbitrary frequency characteristic to be added to the first audio signal and the second audio signal can be arbitrarily selected according to user's preference.

As a second constitution of the audio circuit of the invention comprises, mix means for mixing a first audio signal and a second audio signal and a first filter for extracting a predetermined low frequency sound band and signal from among a third audio signal output from said mix means to output as a fourth audio signal and full-wave rectification means for rectifying said fourth audio signal to double its original frequency to output as a fifth audio signal and a second filter for filtering said fifth audio signal by an arbitrary frequency band characteristic on the basis of an arbitrary frequency to output a sixth audio signal and distribution means for distributing said sixth audio signal into two; and add means for adding said sixth audio signals distributed by said distribution means on said first audio signal and said second audio signal respectively.

As a third constitution of the audio circuit of the invention comprises, a first filter for extracting a predetermined low frequency sound band signal from among a third audio signal output from said mix means to output as a fourth audio signal and amplify means for amplifying said fourth audio signal to output as fifth audio signal and full-wave rectification means for rectifying said fourth audio signal to double its original frequency to output as a sixth audio signal and signal switch means for switching said fifth signal and said sixth signal to output as seventh signal and control means for controlling the switching of said signalswitch means and a second filter for filtering said seventh signal by an arbitrary frequency characteristic on the basis of an arbitrary frequency to output as eighth audio signal and distribution means for distributing said eighth audio signal into two; and add means for adding said eighth audio signals distributed by said distribution means on said first audio signal and said second audio signal respectively.

In above constitution, mix means for mixing the fifth signal of amplification means and the sixth signal of full-wave rectification means to output as a seventh signal can be used instead of said switching means.

In the first constitution describes above of the present invention, L and R signals are mixed and an arbitrary low frequency band component is extracted therefrom through a filter having an arbitrary frequency characteristic, divided into two by distribution means, and the low frequency band component only is added to the original L and R signals keeping the separation of the original L and R signals by add means to reproduce a sound signal with voluminous feeling in the low sound band. Also in the second constitution, in a low frequency band that is difficult to be output by a small speaker, the harmonics are stressed by full-wave rectification means to emphasize low sound feeling. When a switching circuit is provided, stressing of the low sound by an amplifier and stressing of harmonic of low sound band by full-wave rectification means are easily switched. In a constitution in which the output of the full-wave rectification means and the output of the amplifier are mixed, both the effect of stressing of low sound and the effect of stressing harmonic of the low sound are added, so the most appropriate low sound stressed sound signal for a speaker used is reproduced.

BRIEF DESCRIPTION OF THE DRAWINGS

FIG. 3 A wave form diagram of full-wave rectification in the second embodiment of the invention.

DETAILED DESCRIPTION OF THE INVENTION

Figure 1:
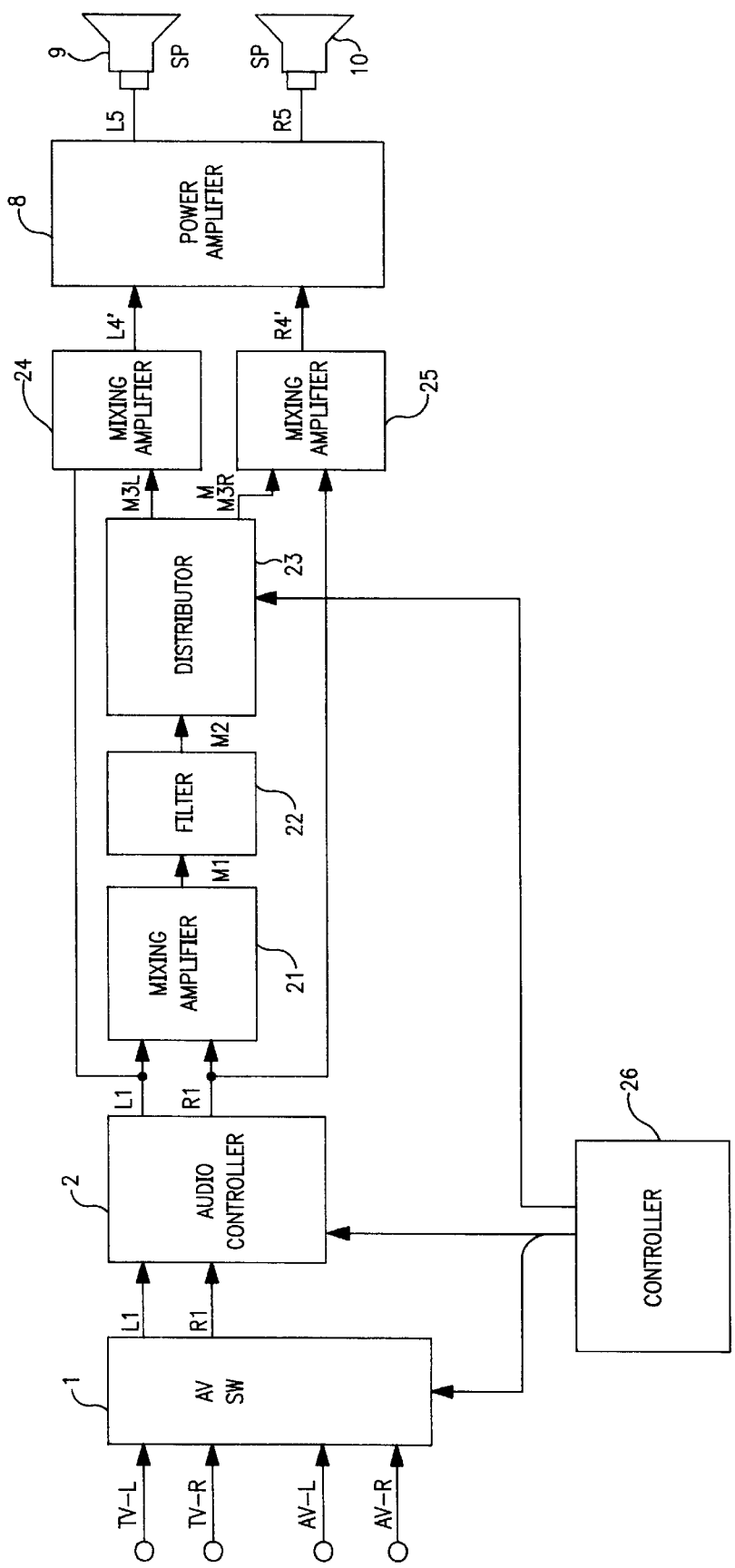
FIG. 1 A block diagram of an audio circuit of a first embodiment of the invention.

An audio circuit of an embodiment of the invention will be illustrated referring to drawings. FIG. 1 is a block diagram of an audio circuit of a first embodiment of the invention. Here, ones having the same mark as in FIG. 7 have the same function, so their descriptions are omitted.

The output of an AV switch for switching TV audio input signals TV-L and TV-R and video-audio input signals AV-L and AV-R to output as output signals L1 and R1 is connected to the input of an audio controller 2 for outputting L2 and R2 signals after controlling L1 and R1 in their bass, treble, balance, volume, surround, and the like. The output of the audio controller 2 which outputs L2 and R2 is connected to the input of a mixing amplifier 21 which mixes the input signals, amplifies the mixed signal to an arbitrary level, and outputs it as signal M1. The output of the mixing amplifier 21 is connected to the input of filter 22 for extracting an arbitrary low frequency band component from input signal M1 through f characteristic having an arbitrary f0 (resonance frequency in a low frequency zone) and Q value and outputting the extracted signal as signal M2. The output of the filter 22 is connected to the input of distributor 23 for separating the input signal M2 to signals M3L and M3R not so as to affect the next stage. This output signal M3L and the output signal L2 of sound controller 2 are connected to the input of the mixing amplifier 24 for mixing the input signals to output mixed signal L4'. The other output signal M3R of distributor 23 and the output signal R2 of sound controller 2 are connected to the input of the mixing amplifier 25 for mixing the input signals to output mixed signal R4'. The outputs of mixing amplifier 24 and 25 are connected to the input of power amplifier 8.

Figure 7:
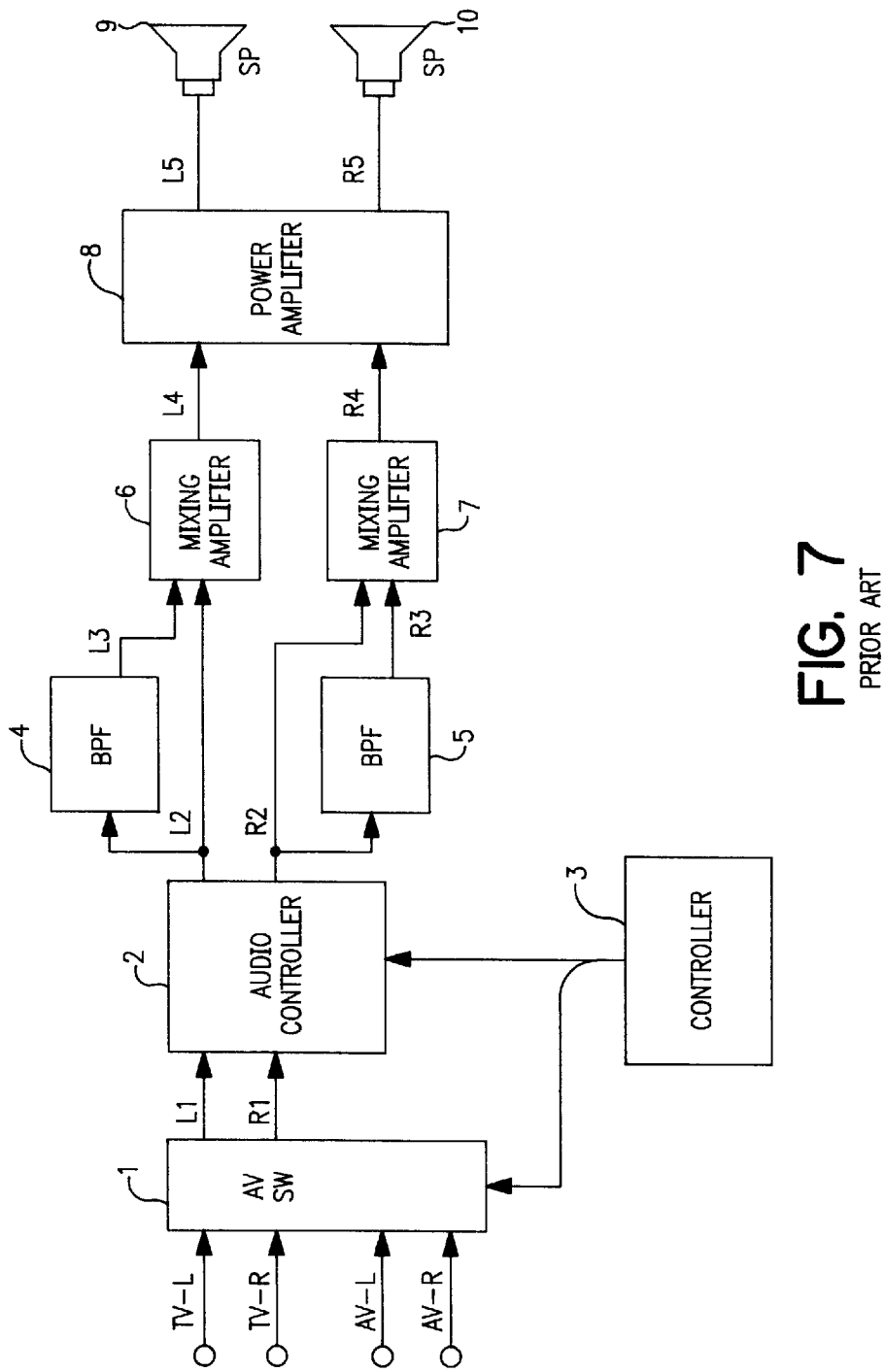
FIG. 7 A block diagram of a conventional audio circuit.
Figure 8:
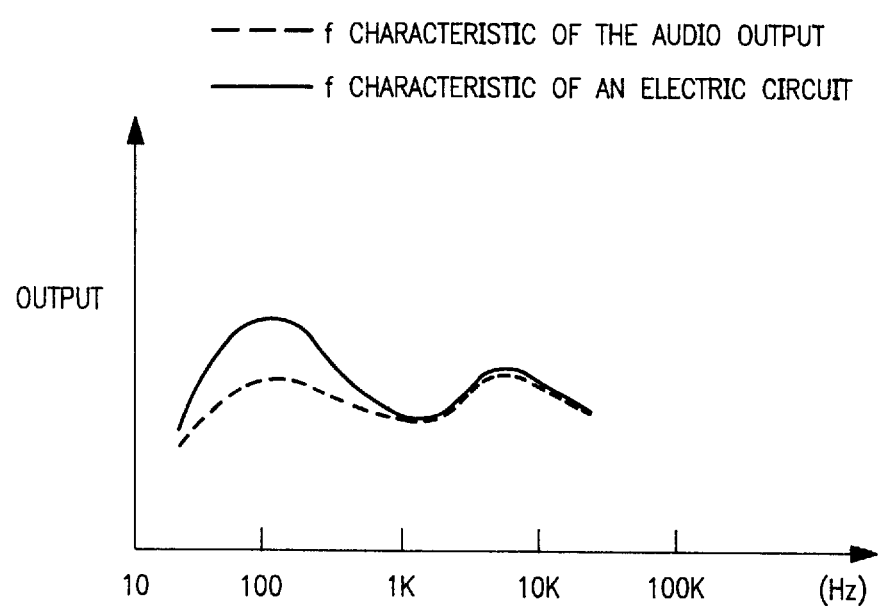
FIG. 8 A frequency characteristic diagram of the output wave of a conventional example.

A controller 26 outputs a switching direction to AVSW 1, and performs various controls on audio controller 2 by command signals, these are the same functions as the conventional controller 3 shown in FIG. 7. Further, it controls the muting of audio mixed signal M2 or the level by steps or continuously if necessary, in distributor 23.

Next, the operation of the first embodiment constituted as said above will be illustrated. Like conventional examples, Each of L2 and R2 signals which are output through AVSW 1 and audio controller 2 is branched off and one pair of them is input to mixing amplifier 21. L2 and R2 signals are mixed in mixing amplifier 21 and amplified to the most appropriate level to the audio system of a television receiver and then output as signal M1. Signal M1 is extracted its low frequency component with arbitrary f characteristic by filter 22 to be output as signal M2. Signal M2 is output as signals M3L and M3R from distributor 23, and added to each of L2 and R2 signals which are branched after audio controller 2 in mixing amplifiers 24 and 25 and input as signal L4' and R4' to power amplifier 8, and amplified there to signals L5 and R5 to drive speakers 9 and 10. At this time, controller 26 can select whether stressed low sound is added to the outputs of speakers 9 and 10 by applying muting control on distributor 23. If necessary, the grade of stressing low sound in the output of speakers 9 and 10 can be controlled by applying level control by steps or continuously. This operation can be performed not only in distributor 23 but also from mixing amplifier 21 through distributor 23.

Each low frequency band component of input and R signals are mixed by mixing amplifier 21 whether it is contained in L or R and again distributed to L and R signals by distributor 23 and reproduced from both speakers, so that the voluminous feeling of the low frequency reproduced is enhanced and affluent low sound stressing can be achieved. The low frequency signal to be distributed to L and R signals is selected by filter 22 so as to be f0 (a resonance frequency in low frequency) of around 100 Hz which is weak zone in directivity of listening feeling, thus feeling of stereo separation when listened is not impeded. Since it is reproduced from left and right speakers at the same level, the voluminous feeling in the low frequency becomes very strong.

Figure 2:
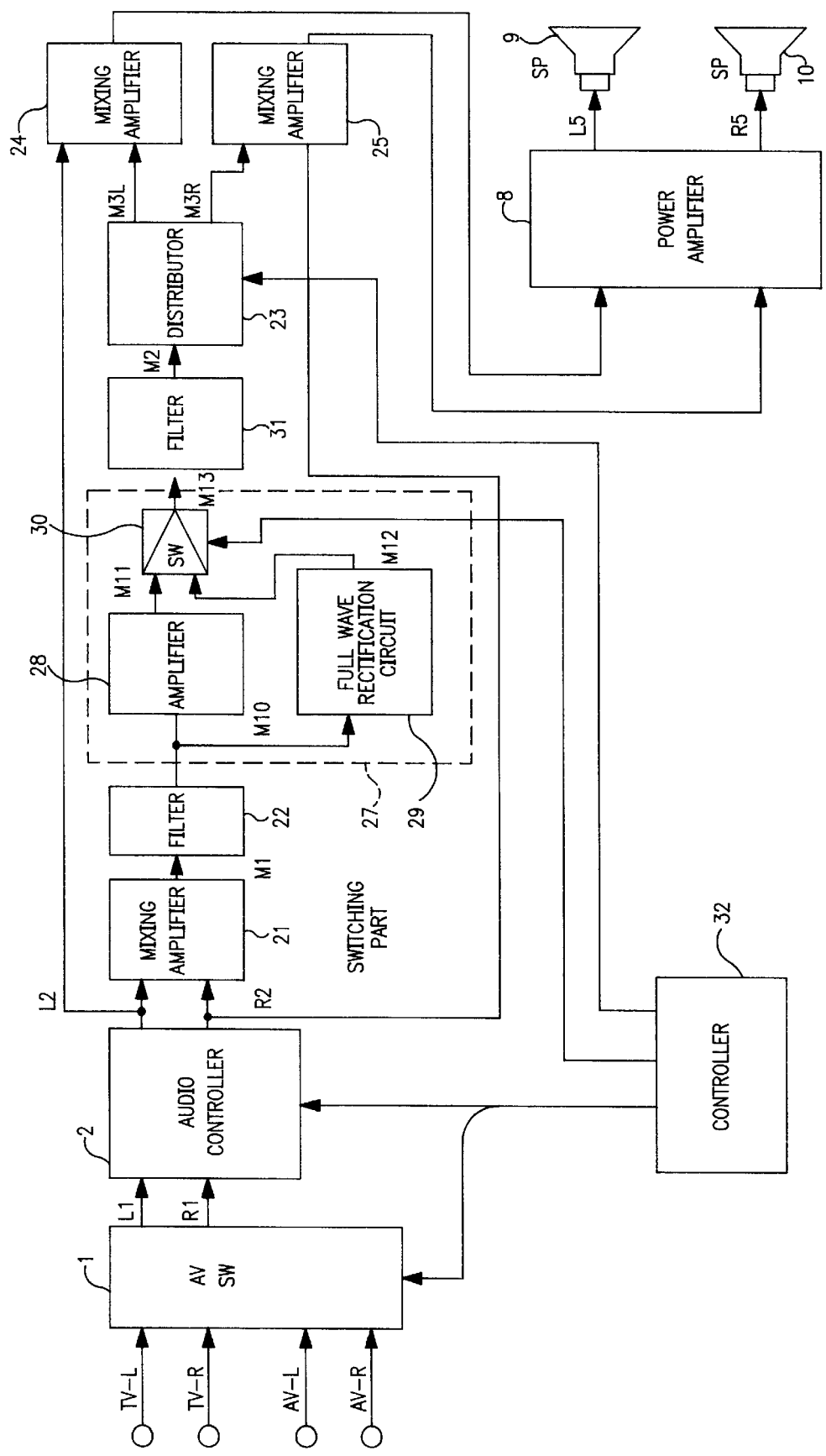
FIG. 2 A block diagram of an audio circuit of a second embodiment of the invention.

Next, a second embodiment of the invention will be illustrated referring to FIG. 2. Ones having the same mark as in FIG. 1 and FIG. 7 have the same function, so the detailed illustration is omitted.

Switching part 27 for selecting processing means of the signal from filter 22 and second filter 31 are added between filter 22 and distributor 23 in the first embodiment in FIG. 1. That is, switching part 27 comprises an amplifier 28 for amplifying signal M10 from filter 22 to an appropriate level to output as signal Mil, full-wave rectification circuit for full-wave rectifying signal M10 from filter 22 to output as signal M12, and a switch (SW) 30 for switching signals M11 and M12 to output as signal M13. The output signal M13 of switching part 27 is input to distributor 23 as signal M2 after passing filter 31 for extracting an arbitrary low frequency band.

A controller 32 has the same functions as controller 26 shown in FIG. 1 in the switching direction to AVSW 1, in various controls on audio controller 2 by command signals, and in muting control or level control of audio signal at distributor 23. Different point is that it further gives switching control to SW 30.

Here, the operation of the audio circuit constituted as above will be illustrated.

In a same manner as the first embodiment shown in FIG. 1, each of L2 and R2 signals is branched respectively, one pair is input to mixing amplifier 21.

L2 and R2 signals are mixed and amplified by mixing amplifier 21 to the most appropriate level for audio system of a television receiver and output as signal M1. Low frequency component having an arbitrary f characteristic is extracted from signal M1 by filter 22 to output as signal M10.

(Illustration about signal M11 side)

The case where SW 30 in switching part 27 is switched to input signal M11 side by controller 32 will be first illustrated. Signal M10 is amplified to the most appropriate level by amplifier 28 to be signal M11, and output from SW 30 as signal M13. Signal 13 is further filtered through filter 31 to be output as signal M2 having an arbitrary f characteristic. In a same manner as in the first embodiment, signal M2 is output from distributor 23 as signals M3L and M3R, and then added respectively to original L2 and R2 signals branched from the output of audio controller 2 at mixing amplifiers 24 and 25 to be signals L4' and R4'. And signals L4' and R4' are input to power amplifier 8 and output as signals L5 and R5 to drive speakers 9 and 10. Whether the low frequency component of each of signals L and R is contained in L or R, it is mixed by mixing amplifier 21 and then distributed to L and R signals. So, voluminous feeling of low frequency band increases and affluent low sound stressing can be achieved.

Low frequency signals to be distributed to L and R signals are filtered by filter 22 to have a f0 (resonance frequency of low frequency band) around 100 Hz which is a zone having week directivity of listening feeling, so the feeling of stereo-separation is not impeded. As the sound is reproduced at the same level from left and right speakers, voluminous feeling of low frequency band is very affluent.

(Illustration about signal M12 side)

Next, the case where SW 30 in switching part 27 is switched to input signal M12 side by controller 32 will be illustrated. Signal M10 is full-wave rectified by full wave rectification circuit 29 to be a doubled frequency and output as M12. Signal M12 is output through SW 30 as signal M13 and cut its high frequency component such as its edge portions by filter 31 to be output as signal M2.

This wave conversion is shown in FIG. 3 using sin curves. (1) is a sin curve of an input signal. (2) is a wave inverted the polarity from phase 180 to 360 of the original sin curve. (3) is a wave eliminated its high frequency (harmonic) component to form a sine curve of doubled frequency of sin curve (1) by a filter.

In a same manner as in the first embodiment, signal M2 is output from distributor 23 as signals M3L and M3R, and then added respectively to original L2 and R2 signals at mixing amplifiers 24 and 25 to be signals L4' and R4'. And signals L4' and R4' are input to power amplifier 8, amplified, and output as signals L5 and R5 to drive speakers 9 and 10. Whether the low frequency component of each of signals L and R are contained in L or R, it mixed by mixing amplifier 24, 25 and then distributed again to L and R signals.

The signal M12 side is an effective method when a speaker having a bad f characteristic in a low frequency band is used. Though low frequency can not be reproduced at a speaker, the shortage of low frequency can be compensated by reproducing its harmonic, so voluminous feeling of low frequency increases so the affluent low sound stressing is achieved.

Low frequency signals to be distributed to L and R signals are selected by filter 22 to have a f0 (resonance frequency of low frequency band) of around 100 Hz which is a zone having week directivity of listening feeling, so the feeling of stereo-separation are not impeded. As the sound is reproduced at the same level from left and right speakers, voluminous feeling of low frequency band is very affluent.

In the second embodiment, in a same manner as the first embodiment, controller 32 can select whether stressed low sound is added to the outputs of speakers 9 and 10 by applying muting control on distributor 23. If necessary, the grade of stressing low sound in the output of speakers 9 and 10 can be controlled by applying level control by steps or continuously. This operation can be performed not only in distributor 23 but also from mixing amplifier 21 through distributor 23.

In the second embodiment, by switching connections in a single circuit according to a speaker used in a television receiver or user's preference by controller 32, more affluent low sound can be effectively reproduced.

Fixed connection of a jumper wire substituted for SW 30, instead of the control by controller 32, is also included in the present invention. As a case, a single full-wave rectification circuit 29 may be used omitting amplifier 28 and SW 30.

Figure 4:
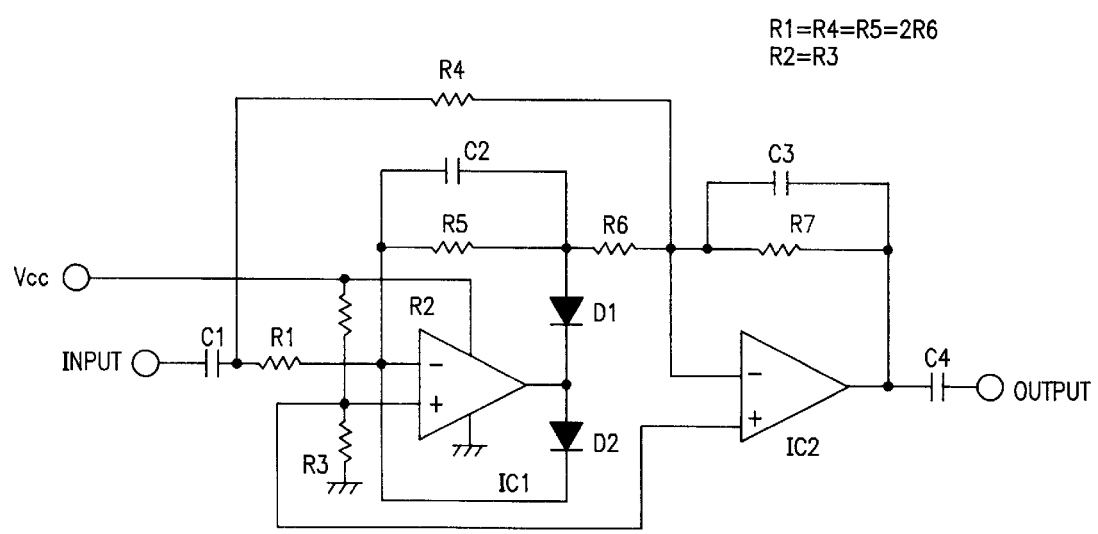
FIG. 4 A circuit diagram of full-wave rectification circuit of the second embodiment of the invention.

Full-wave rectification circuit 29 used in the second embodiment can be realized with a circuit shown in FIG. 4.

Figure 5:
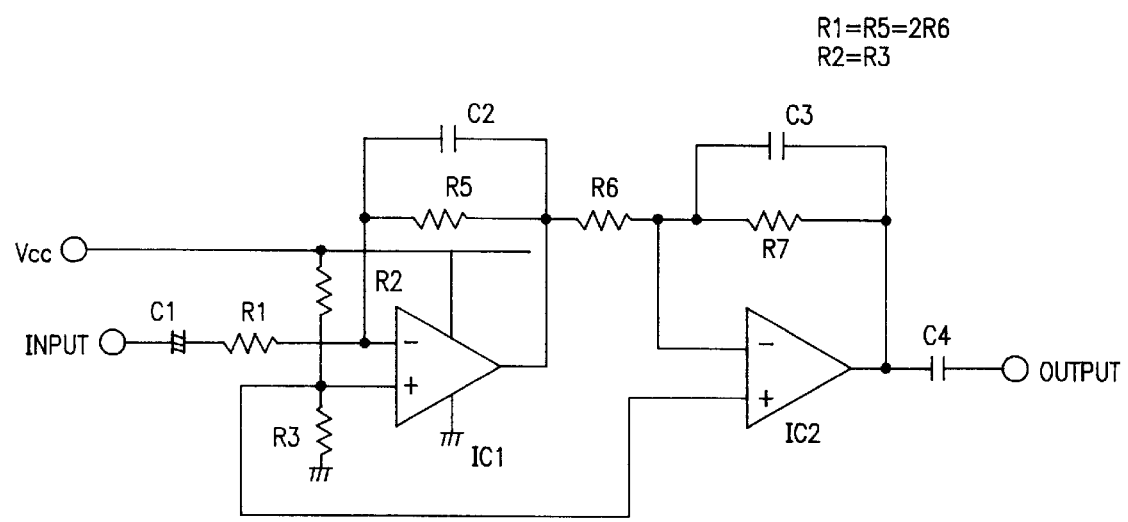
FIG. 5 A circuit diagram changing the connection of full-wave rectification circuit to an amplifier in the second embodiment of the invention.

In FIG. 4, R1, R2, R3, R4, R5, R6, and R7 are resistors, C1, C2, C3, and C4 are capacitor. IC1 and IC2 are operational amplifiers, D1 and D2 are diodes. The case where a circuit to be a full-wave rectifier is changed to only an amplifier using a jumper wire instead of D1 in FIG. 4 and without using D2 and R4 as shown in FIG. 5 and substituting the parts for a switch, is also included in the present invention.

Next, the operation will be illustrated. FIG. 4 is a circuit for converting a sin curve shown in FIG. 3 to the doubled frequency. The sin curve is illustrated as a sample.

Here, we assume that R1=R4=R5=2R6. A sine curve (1) in FIG. 3 input to the INPUT of FIG. 4 is applied to (−) input terminal of IC1. The polarity of the signal is turned over at IC1, the negative half waves input to the INPUT terminal (positive-half waves at the output terminal of IC1) are made zero by diodes D1 and D2. The output thereof is applied to (31) terminal of IC2 through resistor R6 and amplified by a gain −2, turned over its polarity, and output. That is, only the positive half-waves of sine curve (1) input to the INPUT terminal is output at OUTPUT terminal with the same phase and the negative half waves become zero.

While, sin curve (1) which is input to the INPUT terminal and branched is input to (−) terminal of IC2 through R4. The signal which is generated at the connecting point of R5 and R6 is also added to (−) terminal of IC2 through R6. Regarding the sin curve branched, the negative half-wave at INPUT terminal is turned over its polarity by IC2 and output from OUTPUT terminal as a positive sin curve of amplitude 1, while the positive half-wave at INPUT terminal at this time is the opposite polarity to the positive half-wave at INPUT terminal input from R6, so the amplitude becomes 1 by subtraction.

Accordingly, the composite output signal output from OUTPUT terminal is a full-wave rectified wave form of doubled frequency made by being turned over (−) side of sine curve (1) to (+) side as shown by the waves (2) in FIG. 3, and sine curve (3) in FIG. 3 is obtained by passing waves (2) through a low pass filter.

Figure 6:
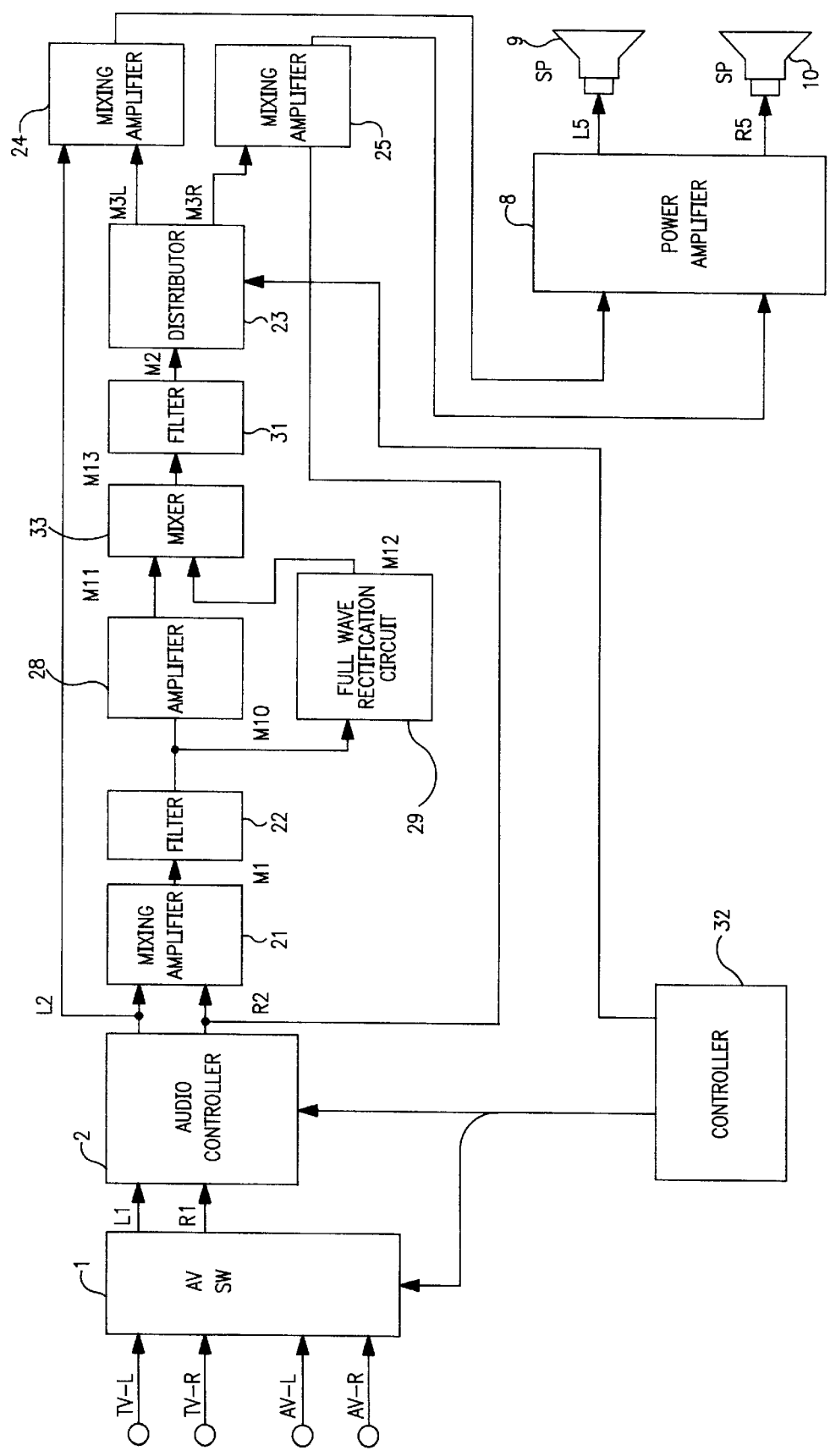
FIG. 6 A block diagram of an audio circuit of a third embodiment of the invention.

FIG. 6 shows a third embodiment of the invention. The third embodiment is as follows that, instead of switching signals M11 and M12 in the second embodiment, M11 and M12 are mixed and harmonic reproduction of the low frequency sound in a reproduction impossible zone for a speaker and also low frequency sound stressing around f0 of an arbitrary frequency are performed to enable reproduction of affluent low frequency sound.

Ones in FIG. 6 having the same mark as in FIG. 2 have the same function, their detailed description are thus omitted. Instead of SW 30 in FIG. 2, a mixer 33 for mixing signals M11 and M12 is provided.

M11 and M12 made by the same manner as in the second embodiment are mixed at mixer 33. As the two kinds of low frequency sound stressing are added, more low frequency sound can be reproduced. As described above, the constitution shown above of an audio circuit of the invention, extracts an arbitrary low frequency band component by a filter having an arbitrary f characteristic after mixing L and R signals, distributes only the low frequency band component of an amplified signal keeping the separation of original L and R signals, by a distributing means, and adds them on the original L and R signals to obtain an excellent effect to reproduce an audio signal being voluminous in low frequency band. Also, by providing a low frequency harmonic stressing circuit, harmonic of the frequency range which can not be reproduced by a speaker is reproduced to stress low frequency sound feeling. Further, by providing a switching circuit and a low frequency sound harmonic stressing circuit, a low frequency sound stressing circuit and low frequency harmonic stressing circuit can be easily switched or both the low frequency sound stressing circuit and the low frequency harmonic stressing circuit are used and the outputs of the both are mixed and so on, and the low frequency sound stressing is allotted to a low frequency band and an ultra low frequency band so that more effective low frequency sound stressing effect can be obtained. Also, an excellent effect that the most suitable low frequency sound stressing circuit can be formed according to an inch constitution of a television receiver or a speaker used can be obtained.

The detailed circuit constitution, numerical values, drawings in above embodiments are examples, and are not intended as a definition of the limits of the invention, it is needless to say that changes may be done within the spirit of the invention.

What is claimed:

1. An audio circuit for use with a speaker comprising:

mix means for mixing a first audio signal and a second audio signal to generate a third audio signal;

a first filter for extracting a predetermined low frequency band signal from the third audio signal, wherein said predetermined low frequency band signal is a fourth audio signal having a frequency;

full-wave rectification means for one of a) rectifying and b) amplifying said fourth audio signal to generate a fifth audio signal having a frequency double the frequency of said fourth audio signal, wherein said full-wave rectification means is switchable to a simple amplifier through one of shortening and opening a specified portion of said full-wave rectification means;

a second filter for extracting, based upon sound frequency characteristics of said speaker, a signal in a low frequency band from said fifth audio signal, wherein said extracted signal is a sixth audio signal;

distribution means for distributing said sixth audio signal into two further audio signals; and add means for adding said further audio signals to said first audio signal and said second audio signal respectively.

2. An audio circuit for use with a speaker comprising:

mix means for mixing a first audio signal and a second audio signal to generate a third audio signal;

a first filter for extracting a predetermined low frequency band signal from the third audio signal, wherein said predetermined low frequency band signal is a fourth audio signal having a frequency;

full-wave rectification means for one of a) rectifying and b) amplifying said fourth audio signal to generate a fifth audio signal having a frequency double the frequency of said fourth audio signal, wherein said full-wave rectification means is switchable to a simple amplifier through one of shortening and opening a specified portion of said full-wave rectification means;

a second filter for extracting, based upon sound frequency characteristics of said speaker, a signal in a low frequency band from said fifth audio signal, wherein said extracted signal is a sixth audio signal;

distribution means for distributing said sixth audio signal into two further audio signals; and add means for adding said further audio signals to said first audio signal and said second audio signal respectively; and control means for controlling at least one of i) an on-off and ii) a signal level of said sixth audio signal.

* * * * *